United States Patent [19]

Volz et al.

[11] 4,031,525

[45] June 21, 1977

[54] PROCESS FOR RECORDING AND REPRODUCTION OF INFORMATION IN ELECTROMAGNETIC FORM

[75] Inventors: Horst Volz; Reinhard Straubel; Arnulf Hager, all of Berlin, Germany

[73] Assignee: VEB Kabelwerk Oberspree (KWO), Berlin-Oberschoeneweide, Germany

[22] Filed: Apr. 8, 1974

[21] Appl. No.: 458,933

[52] U.S. Cl. .................. 340/174 MS; 340/174 SB; 340/174 ZB
[51] Int. Cl.² ....................................... G11C 13/00
[58] Field of Search ............. 340/174 MS, 174 SB, 340/174 ZB, 173 MS

[56] References Cited

UNITED STATES PATENTS 3,551,902  12/1970  Sagnis, Jr. et al. ........... 340/174 SB

OTHER PUBLICATIONS

Proceedings–Fall Joint Computer Conference, 1966, pp. 333–347.

*Primary Examiner*—James W. Moffitt
*Attorney, Agent, or Firm*—Nolte and Nolte

[57] ABSTRACT

A process for the storage and retrieval of information in electromagnetic form from an information carrier, made of ferromagnetic, ferrimagnetic, antiferrimagnetic, metamagnetic ferroelectric or antiferroelectric material. An information carrier builds up a stationary image of the information signal in one dimension along the propagation path of the signal obtained by a short-term high frequency pre-polarization of information carrier by means of an alternating electric or magnetic field. Reproduction of the information can be obtained by analogous means either non-destructively or destructively.

23 Claims, 14 Drawing Figures

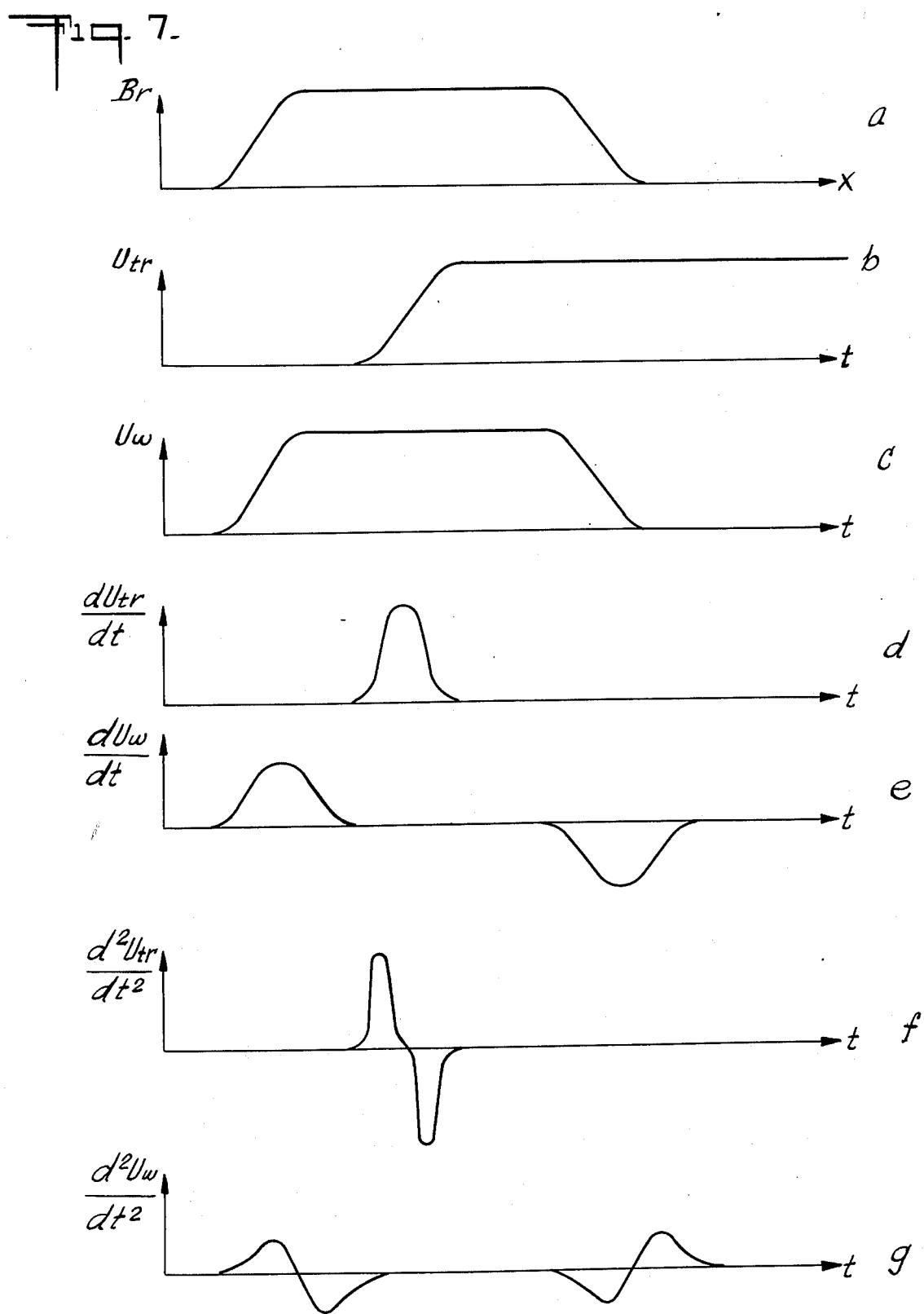

PROCESS FOR RECORDING AND REPRODUCTION OF INFORMATION IN ELECTROMAGNETIC FORM

This invention relates to a process for the storage and retrieval or readout of information in electromagnetic form using an information carrier consisting of ferromagnetic, ferrimagnetic, antiferromagnetic, meta-magnetic, ferroelectric, or antiferroelectric material, which is located within a conductor, surrounding a conductor or which serves itself as a waveguide.

Methods for magnetic recording of information can be divided into two groups. One group uses memories where the information carrier is in motion and another group uses static memories, where the information carrier is at rest. Magnetic tapes, magnetic records, and magnetic drums belong to the first group. The upper frequency limit of the first group is determined by the mechanical dimensions of the recording and reproducing heads, and by the relative velocity of the information carrier.

A videoband processor of conventional design has an upper frequency limit of about 10MHz. This limit is reached, however, only at the expense of a considerable loss of bits due to errors which occur at that speed. In the interest of information reliability, it is preferable, therefore, to work at a considerably lower frequency, e.g., 250 Khz for magnetic record type memories, magnetic drum memories and digital processors. The access time of these memories is large, since the information carrier must be transported past the reproducing head for the playback or retrieval of the desired information.

Fluctuations of the information carrier's transport system cause velocity modulation and fluctuations in the distance between the information carrier and the recording or reproducing head cause loss of the stored information.

Methods for the magnetic recording of information using static memories have been employed using matrix memories. A characteristic feature of matrix memory is the coincidence of two signals at a random location, one of these signals being the information signal. The upper frequency limit of the matrix type memory is determined both by the shortest possible switching time of the elements of the matrix based on the coincidence of two signals and the bit propagation time along the rows and columns of the matrix. Current upper frequency limits lie between 10 and 50 MHz. Thin film memories have, in particular, a short access time compared to memories where the information carrier is in motion.

Magneto-optic memories may have an upper frequency limit of 10 MHz.

One static method uses the propagation time of electromagnetic signals along conductors to record binary information. A binary coded signal is applied to a conductor. The information carrier is mounted on the conductor.

The information carrier may have a saturation state of positive or negative residual magnetism along the conductor. The polarity of the individual signal impulses is selected to magnetize the information carrier in a direction opposite to state of residual magnetism. These signals are half impulses, i.e., their amplitude is one half of the amplitude necessary to remagnetize the information carrier to a state opposite to the state of its residual magnetism. To record this train of impulses a single impulse is sent along the conductor from the terminal opposite to the signal input terminal. This single impulse has the same polarity as the train of signal impulses, and is also a half impulse. The single impulse and the train of impulses arrive at any point of the conductor delayed by the propagation time to such a point. Whenever the single impulse and an impulse of the train of impulses reach a point on the conductor simultaneously, these two impulses are superimposed and changed from a half impulse to a full impulse. This full pulse has the necessary amplitude to remagnetize the information carrier. The information carrier is, therefore, remagnetized to an opposite polarity at all points of coincidence of the half impulse and the train of impulses. A representation of the train of signal impulses is, therefore, magnetically recorded along the conductor.

A recording using this process can also be made by transmitting a train of impulses and a single recording impulse from an input terminal end of a line if the other end of the line is short-circuited. Depending on the transmission sequence, either the single impulse or the train of impulses will be first reflected from the short-circuited end of the line. The train of impulses and the single impulse then travel in opposite directions, and a recording is obtained in the manner discussed above. Playback of the information can be obtained destructively by a remagnetization of the information carrier to its original state of residual magnetism. This is achieved by transmitting a full impulse along the line.

Non-destructive play back can be obtained by transmitting an impulse along the line which does not cause any remagnetization of the information carrier, and which only senses magnetic inhomogeneities. This memory relies, as does the matrix type of memory, on coincidence switching of the information carrier for recording the information. A coincidence of two signals also occurs here, one signal being the information signal. The resulting signal amplitude is made up of two half impulses, neither of which are strong enough to remagnetize the information carrier. Both half pulses are superimposed at coincidence and changed to a full impulse. This full impulse changes the information carrier to a saturation state opposite to the direction of its original state of saturation. Since the time required to obtain remagnetization is inversely proportional to the applied field strength, this memory, as well as the matrix type of memory, is limited by the time required to obtain remagnetization. The remagnetization field strength is in turn limited by the amplitude of the half impulse. The memory described is, nevertheless, an improvement over the matrix type of memory, since the latter is a two-dimensional memory, the memory location of which is governed by two coordinates, whereas the conductor type of memory has a memory location determined by only one coordinate. This avoids the complicated two-coordinate driving arrangement of the matrix type memory.

Similar limitations of the upper frequency response do not exist for circulating memories. Information is circulated in a closed transmission system, and must be regenerated after every circulation of the information. Circulating memories, however, require a permanent power supply. If the power supply is interrupted, the stored information is destroyed and lost.

It is the object of this invention to avoid the above disadvantages of known information recording systems, and in particular, to increase the upper frequency limit of the storage of information.

Briefly stated, the invention provides a method for the recording and reproduction of the information in electromagnetic form which includes as an essential feature, the short duration high-frequency pre-magnetization, or short duration pre-polarization of an information carrier made of ferromagnetic, ferrimagnetic, antiferromagnetic, metamagnetic, ferrroelectric or antiferroelectric material for the recording of information propagating along the information carrier in the form of an electromagnetic wave. The objectives of this invention are to increase the upper frequency limit of recording and to avoid the complicated driving process of driving a matrix-type of memory to store and retrieve information.

The reproduction of the stored information is achieved by a short duration reversible or irreversible remagnetization or repolarization, or by a short duration demagnetization or depolarization of the information carrier. The information can be read out either destructively non-destructively. The process is also suitable for obtaining derivatives of the information signal.

The invention is only described by means of the example of the magnetic information carrier since in case of ferroelectric information carriers the process is the same. Only the technical terms are exchanged.

The information signal magnetizes the information carrier within the range of the latter's reversible initial permeability.

The invention will be further illustrated by way of a few examples, shown in the following illustrations, wherein:

FIG. 7 shows various readout curves in accordance with the invention as a function of the driving voltage.

FIG. 7a shows the residual magnetism of the memory as a function of distance.

FIG. 7b shows the driving voltage as a function of time.

FIG. 7c shows the readout of the zero order derivative of the information stored in the memory.

FIG. 7d shows the first derivative ($dUtr/dt$) of the driving voltage.

FIG. 7e shows the readout of the first derivative of the information stored in the memory.

FIG. 7f shows the second derivative ($d^2Utr/dt^2$) of the driving voltage.

FIG. 7g shows the readout of the second derivative ($d^2Uw/dt^2$) of the information in the memory.

In the process of the invention, the high frequency pre-magnetization of the information carrier is achieved by a high frequency impulse, the initial amplitude of which drives the information carrier into at least a region of magnetic saturation, and which dies down to zero within a few wavelengths. The form of such an impulse is illustrated by the curve $H_r$ of FIG. 1.

Figure 1:
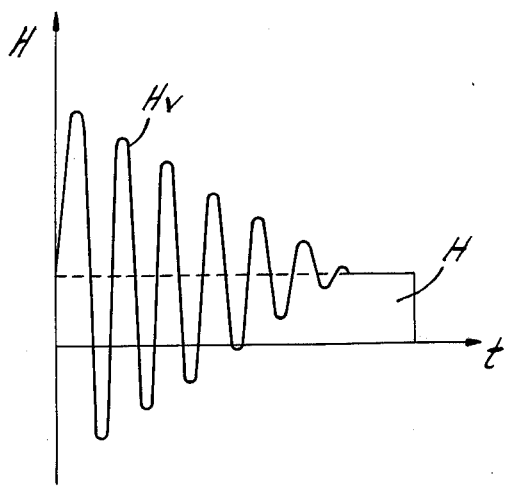
FIG. 1 is a curve illustrating the superposition of a modulating constant magnetic field H with the high frequency pre-magnetization $H_r$.
Figure 2:
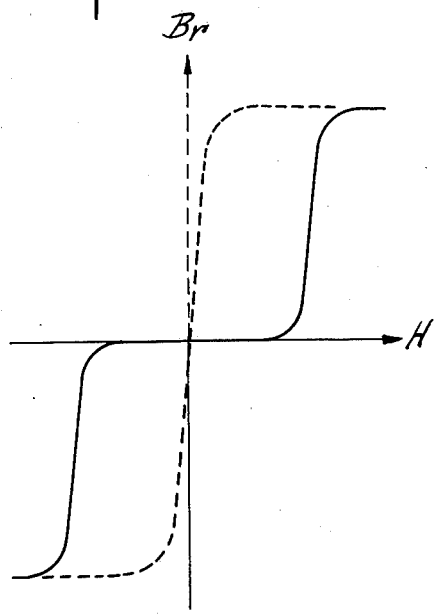
FIG. 2 shows the effects of the high frequency premagnetization on residual magnetism. The dotted line shows a remanence curve using high frequency premagnetization, and the solid line represents a conventional remanence curve without high frequency premagnetization.
Figure 3:
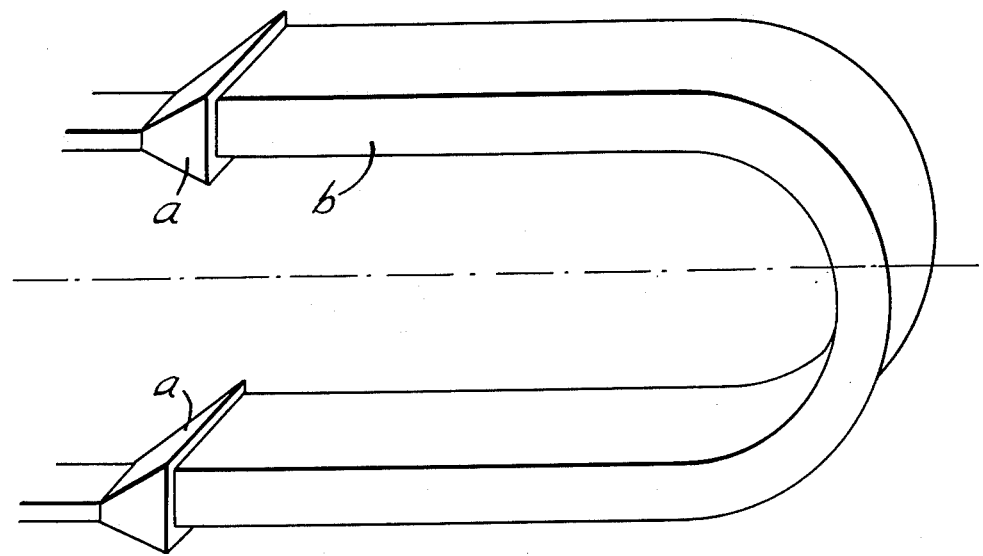
FIG. 3 is a perspective view of a conductor having a memory. The information signal and the high frequency pre-magnetization are transmitted via horn antennae $a$ to information carrier $b$.

The high frequency pre-magnetization causes a temporary linearization of the remanence curve of the information carrier. This linearization is illustrated in FIG. 2 wherein the solid curve shows a remanence curve without high frequency premagnetization and the dotted curve shows the remance with high frequency premagnetization. The simultaneously present magnetic field, which magnetizes the information carrier within its range of initial permeability and is superimposed on the high frequency impulse as shown in FIG. 1, causes the appearance of considerable residual magnetism in the information carrier. This is also true for partially ideal magnetization, only a negligible amount of residual magnetism, however, is produced without such high frequency pre-magnetization. Both the signal and the high frequency magnetization can be transmitted to the information carrier $b$ via an antenna $a$ as illustrated in FIG. 3, from suitable sources connected to one or both of the antennas, and can propagate along the surface of the information carrier. The signal and the high frequency pre-magnetization can, alternately, however, also both propagate along the information carrier via conduction in the information carrier.

Figure 4:
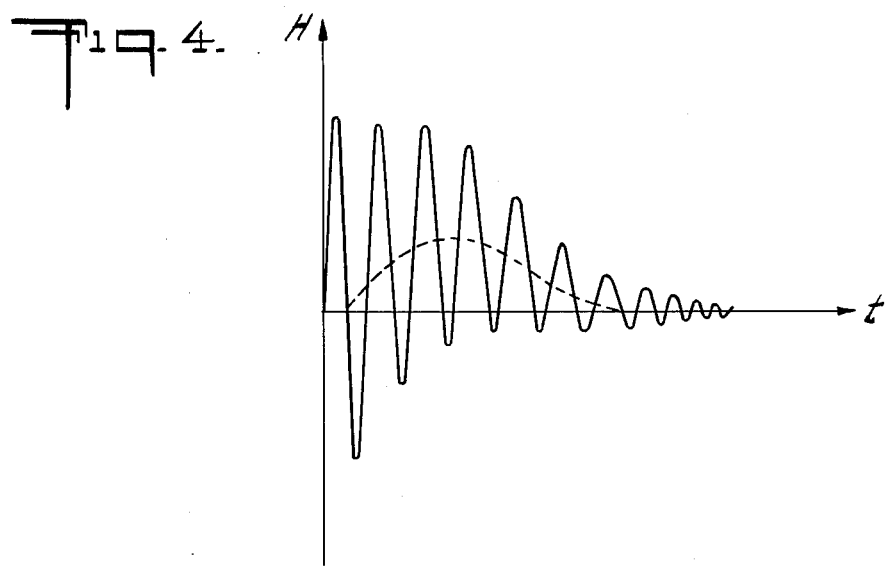
FIG. 4 shows the function depicting magnetic field strength vs. time at a memory location. The dotted line depicts the information signal field delayed by the propagation time.

The information signal on one hand, and the premagnetization signal on the other hand, exhibit, depending on their wave type and dispersion, have different propagation characteristics. They can propagate along the information carrier either in the same direction, or in opposite direction. In order to record an information signal propagating along the information carrier, a high frequency pre-magnetization impulse is transmitted to propagate along the information carrier. The information signal and the pre-magnetization impulse arrive at any point of the information carrier along their respective paths of propagation, delayed by their respective propagation time. The appropriate values of the information signal and the pre-magnetization impulse are superimposed at that point, as illustrated in FIG. 4. The appropriate values of the information signal and of the pre-magnetizing field are superimposed at this location. The resultant field is shown as a solid line, being an alternating sequence of peak values of the field strength. The resultant field is an alternating sequence of peak values of the field strength of the combined signal.

As a result of the temporary linearization of the remanence curve of the information carrier, the value of the information signal at the time and point in question is thus recorded in the form of an corresponding value of the residual magnetism of the information carrier. This process causes the temporary appearance of the signal along the propagation path of the information in the form of corresponding values of residual magnetism of the information carrier. Any signal passing through such a point after the recording has taken place will not change the value of the residual magnetism, since it can only magnetize the information carrier within the range of its reversible permeability.

The information stored in this way can be played back by remagnetizing the whole information carrier. If such remagnetization is made irreversible, it will, however, destroy the stored information. Reversible remagnetization permits non-destructive playback, and the stored information is thereby preserved. Information can also be played back by temporary demagnetization of the information carrier at the price of destructive loss of the information. To implement the playback requires the transmission of a driving voltage in the form of an impulse, step function or high frequency demagnetizing impulse of the same shape as the high frequency pre-magnetizing impulse, for example, via an antenna $a$ to the information carrier $b$ as illustrated in FIG. 3 or alternately, to its surface along the direction of the recording path. Such a driving voltage can, however, also be propagated along the recording path by means of a conductor. The signal and the driving voltage may have different propagation velocities, depending on their respective wave type and dispersion. An impulse voltage is induced at point of the information carrier which is reached by the driving voltage as a result of the remagnetization or demagnetization of the residual magnetism of the information carrier at that point.

The voltage impulses propagating in both directions on the conductor, are superimposed (delayed by their propagation time and the propagation time of the driving voltage) at the respective ends of the conductor to result in a temporary representation of the stored information. The upper frequency limit and the storage density of the recording process are determined by the propagation velocity of the electromagnetic wave along the information carrier. If the signal is propagated at the velocity of light along the information carrier and if one bit per micrometer is to be stored, the information frequency must be about $3\times10^{14}$. The corresponding frequency of pre-magnetization is about $3\times10^{15}$. A reduction in the velocity of propagation by the use of a delay line carrying the information signal along the information carrier permits the recording of signals within a frequency band which can be implemented with current technology at an adequate recording density.

Figure 8:
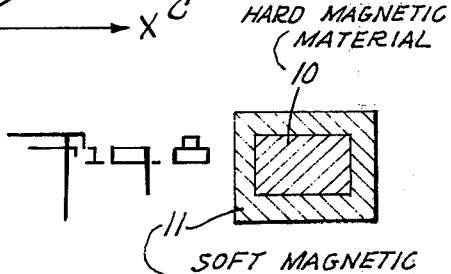
FIG. 8 is a cross-sectional view of one embodiment of an information carrier in accordance with the invention.

Non-destructive readout requires the use of an information carrier, which can be reversibly remagnetized. An information carrier of this type, as illustrated in FIG. 8, may consist of a hard magnetic layer 10 (i.e. having a high coercivity), covered by a soft magnetic layer 11 (i.e. having a low coercivity). The stray magnetic field of the hard magnetic layer of the information carrier magnetizes the soft magnetic layer depending on the residual magnetism of the hard magnetic layer. If the amplitude of the impulse or step-function shaped driving voltage is selected at readout to remagnetize only the soft magnetic layer, then the residual magnetism of the hard magnetic layer will be preserved.

Figure 5:
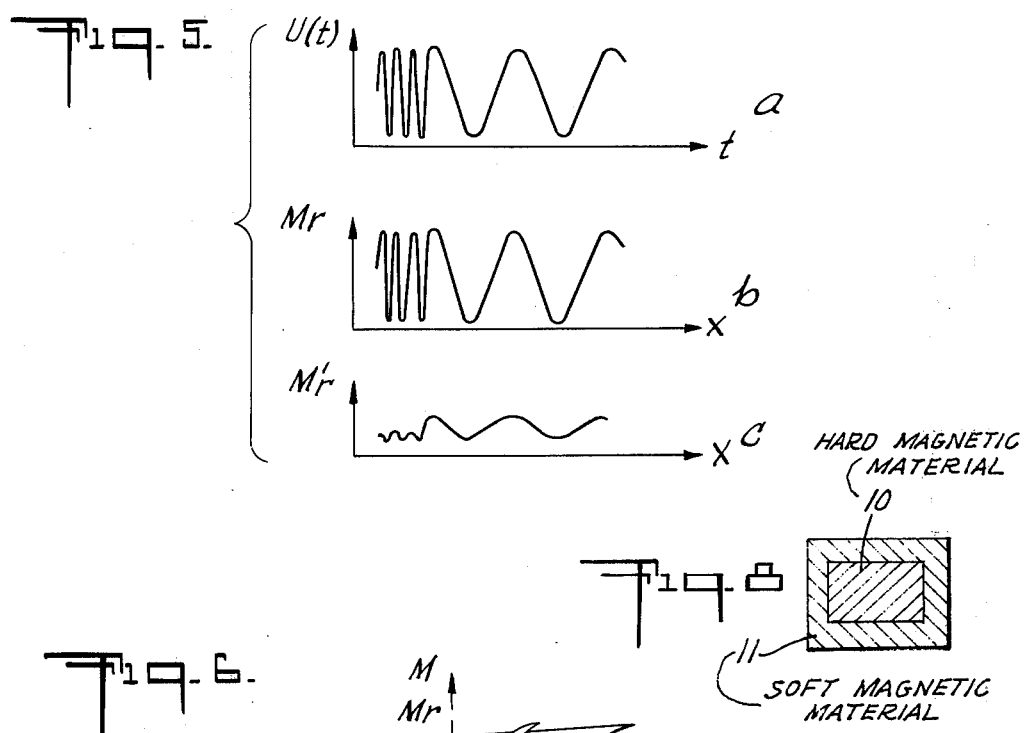
FIG. 5 shows an information signal denoted by $a$, a signal stored in the memory of the information carrier denoted by $b$, and a signal stored in the memory of a soft magnetic material having high permeability denoted as $c$.
Figure 6:
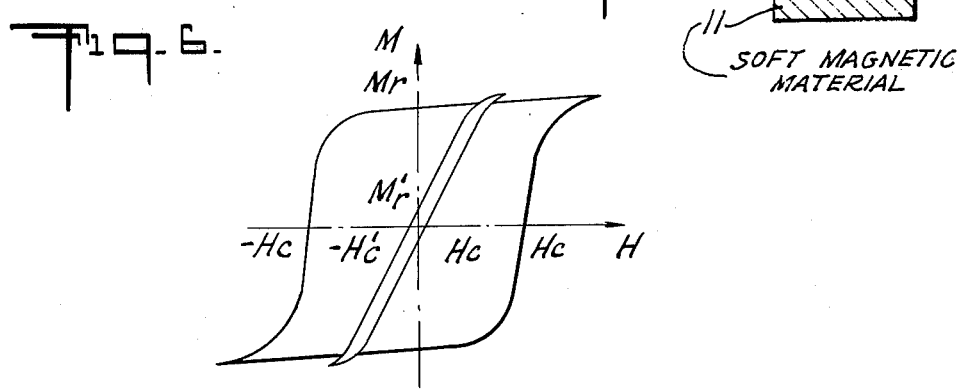
FIG. 6 shows the limits of the hysterisis loops in the BH diagram of both the magnetic material having low coercivity and high permeability (the narrow loop) and the hard magnetic material of the information carrier having high coercivity (the broad loop).

When the driving impulse has died out, the soft magnetic layer is remagnetized, depending on the residual magnetism of the hard magnetic layer. Thus, as illustrated in FIG. 5, the information of FIG. 5 $a$ is stored as a signal shown in FIG. 5 $b$ in the hard magnetic layer, and this magnetization remagnetizes the soft magnetic layer as illustrated in FIG. 5 $c$. FIG. 6 shows the wide hysterisis loop of the hard magnetic material and the narrow hysterisis loop of the soft magnetic material. A reversibly remagnetizable information carrier may also consist of material which is magnetizable in a preferred direction of magnetic recording of a magnetically anisotropic material.

A corresponding field of the driving voltage which is perpendicular thereto changes the magnetizing vector of the appropriate layer at every point by a certain angle. This in turn changes the magnetic flux and produces the corresponding readout. When the driving voltage is no longer applied the magnetic vector of the information carrier is restored to its original position. The readout voltage for this case will be smaller compared to the case where complete remagnetization takes place.

To reduce the velocity of propagation within the conductor with a view to obtaining a high density, it is also possible to add soft magnetic materials which have high permeability and/or dielectrics with a high dielectric constant, such as FERROELEKTRIKA, to the information carrier in its immediate vicinity. The information carrier designated for the recording of the information signal then acts as a highly coercive thin layer.

Following the recording, the of the magnetic or ferroelectric materials of low coercivity is also low compared to the of the information carrier as seen in FIG. 5 $c$ and corresponds only partly to the information carried by the information carrier in view of the frequency-dependent demagnetization or depolarization. The magnetic and/or ferroelectric material of low coercivity is also remagnetized or repolarized during readout due to the remagnetization or repolarization of the information carrier resulting in turn from the propagation of a driving voltage impulse along the conductor or information carrier. An impulse voltage is generated at every point of the conductor and corresponds to the residual magnetism found at that point. Since the cross-section of the information carrier is small compared to the cross-section of the magnetic and/or ferroelectric material of low coercivity, the contribution of the former towards a change of flux at any point is small.

This, in turn, means that the impulse voltage induced at any point of the conductor does not correspond to the residual magnetism of the information carrier. Following the propagation of the former towards and super position at the terminals of the conductor, it will no longer be possible to obtain an electromagnetic signal corresponding to the information carried by the information carrier.

A readout of the stored information can, however, be obtained in this case if the portion of the soft magnetic or ferroelectric material having low coercivity and high permeability is remagnetized or repolarized to saturation by the transmitted driving voltage impulse.

As will be evident from the hysterisis loop of both the highly coercive material of the information carrier and also of the materials of low coercivity as shown in FIG. 6, magnetization of the highly coercive information carrier will only take place in the latter's reversible range.

The driving impulse which remagnetized or repolarizes the material of low coercivity will, according to this process, retain its maximum amplitude, so that the material of low coercivity will remain in the saturated state. When the voltage impulses induced at any point of the conductor have progressed to the terminals of the conductor, a second driving voltage impulse is superimposed on the first driving voltage impulse. The amplitude of the latter is selected to remagnetize or repolarize the information carrier to saturation. The resultant voltage impulses appearing at any point of the conductor result, at the respective terminals of the conductor, in an electromagnetic signal corresponding to the information stored by the information carrier. Following playback both driving voltage impulses are allowed to die out.

A readout of the desired information can also be obtained, if the material of low coercivity is demagnetized or depolarized by a high frequency impulse, the initial amplitude of which causes the material of low coercivity to reach saturation and also causes the information carrier to remain in its reversible range, the high frequency impulse itself dying down to zero within a few cycles. Readout of the stored information can be achieved subsequently by demagnetizing or depolarizing the information carrier by a high frequency impulse. The reproduced information depends on the type of the driving voltage when the information carrier is reversibly remagnetized. If the memory is driven by the derivative of zero order of the step function, then the differential or difference coefficient of zero oder of the information signal stored in the memory, for example as shown in FIG. 7a., is read out as illustrated in FIG. 7c with the driving voltage of FIG. 7b.

Modulation of the memory by the first derivative of the step function shown in FIG. 7d leads to a readout of the first differential coefficient of the stored signal as shown in FIG. 7e. Modulation by the nth derivative of the driving voltage leads to a readout of the nth differential coefficient of the stored signal.

Depending on the propagation velocity of the information signal and the high frequency pre-magnetization, as well as the damping and duration of the pre-magnetization, the memory process is subject to a factor of transposition of the recording of information. The readout of the stored information is subject to a factor of transposition of readout as a function of the propagation velocity of the driving voltage and the information signal.

At the terminals of the conductor, or of the memory into which the driving voltage is transmitted, the factor of transposition of the readout lies within the interval ($-\frac{1}{2}$, 0). At the other end of the memory or memory-line, the factor of transposition lies within the interval ($-\infty$, $\infty$).

The magnitude of the factor of transposition of the recording process is determined by the ratio of the wave length in free space to the wave length of the memory. The magnitude of the factor of transposition of the readout process is determined by the ratio of the wave length in the memory to the wave length of the reproduced wave. If the factor of transposition is positive, the sequence of bits is preserved during transmission, whereas it is reversed when the the factor of transposition is negative.

The recording system described increases the upper frequency limit of current storage or memory technology by a factor of at least $10^3$, since the initial amplitude of the high frequency pre-magnetization can be selected to be arbitrarily large for a sufficiently rapid remagnetization of the information carrier. As opposed to the case of half impulses of coincidence type memories, there is no limitation insofar as the amplitude of the pulses is concerned, the access time of the stored information is small compared to that of a conventional memory; it is simply a function of the propagation velocity.

By choosing the factor of transposition suitably, the information signal frequency can be arbitrarily moved up or down with the frequency spectrum, and the transmission channel capacity can, therefore, be designed accordingly. Short term transient events occurring in nuclear physics or astronomy can, following their recording, be heterodyned down in frequency, so that conventional oscillographs can be used for the display of such events. The high channel capacity also improves the process of committing the information to memory, and hence makes data processing more economical. Local fluctuations of the propagation velocity along the information carrier do not lead to a flutter of the signal as a result of committing it to the memory. The memory is also capable of use as a function generator. Following the recording of a function, the function itself, or a differential coefficient of arbitrary order of that function can be played back an arbitrary number of times, so that it is even possible to correct the function between readouts by recording it anew.

The memory process uses an information carrier which is at rest, and hence no wear occurs. If the memory is, for example, in the form of a conductor, and the conductor is wound around a coil, then the memory has the form of a volume. The complicated coordinate driving systems of matrix memories are, therefore, rendered unnecessary.

It should be understood, of course, that the foregoing disclosure relates only to preferred embodiments of the invention, and that it is intended to cover all changes and modifications of the examples of the invention herein chosen for the purpose of the disclosure which do not constitute departures from the spirit and scope of the invention set out in the appended claims.

What is claimed is:

1. A process for the storage and readout of information in electromagnetic form which comprises:
   a. modulating an information carrier with an information signal, within the range of the reversible permeability or reversible dielectric constant of said information carrier, wherein the information carrier is comprised of a material selected from a group consisting of ferromagnetic, ferrimagnetic, antiferrimagnetic, ferroelectric and antiferroelectric, metamagnetic, materials, said modulating comprising propagating said signal along a conductor,
   b. forming an image of said information signal along the propagation path of the information carrier in the form of values of residual magnetism and/or residual dielectric polarization by short term high frequency pre-magnetization and/or short term high frequency dielectric pre-polarization of said information carrier, comprising applying an alternating electromagnetic field to said carrier, and c. reading out the stored information by a short term magnetization step and/or short term dielectric polarization step comprising applying an alternating electromagnetic field to said carrier.

2. The process of claim 1, wherein said step of reading out comprises reading out said information destructively.

3. The process of claim 1, wherein said step of reading out comprises reading out said information non-destructively.

4. The process of claim 1, wherein said magnetization step and/or dielectric polarization step is reversible and comprises a process of remagnetization and/or repolarization.

5. The process of claim 1, wherein said magnetizing step and/or dielectric polarization step is reversible and comprises a process of demagnetization and/or dielectric depolarization.

6. The process of claim 1, wherein said magnetization step and/or dielectric polarization step is irreversible and comprises a process of remagnetization and/or dielectric repolarization.

7. The process of claim 1, wherein said magnetizing step and/or dielectric polarization step is irreversible and is a process of demagnetization and/or dielectric depolarization.

8. The process of claim 1, comprising reading out said information carrier non-destructively, said reading out being dependent on the number of successive short term remagnetizations and/or dielectric repolarizations of said information carrier, whereby $n$ of said remagnetizations and/or dielectric repolarizations cause readout of the $(n-1)$th differential quotient of said stored signal, with the stored signal being in analog form, said reading out comprising applying a driving voltage to said carrier, the information propagating along said conductor being dependent on said driving voltage, said driving voltage being the differential coefficient of the $n$th order of a stepfunction causing a readout of the differential quotient of $n$th order of the stored signal.

9. The process of claim 1, wherein said modulating step is a read-in process having a read-in factor of transposition, said factor of transposition depending on the propagation velocity of the information signal, the high frequency pre-magnetization or the dielectric high frequency pre-polarization and the factor of damping and the duration of said high frequency pre-magnetization or the dielectric high frequency pre-polarization, retrieval of said stored information comprising a read-out process having a readout factor of transposition, said factor being dependent on said propagation velocity of said information signal and said driving voltage.

10. The process set forth in claim 1, comprising reading out said information carried non-destructively, said reading out being dependent on the number of successive remagnetizations and/or dielectric repolarizations of said information carrier, whereby $n$ of said remagnetization and/or dielectric repolarization cause readout of the $(n-1)$th difference quotient, said stored signal being in discrete form, said reading out comprising applying a driving voltage to said carrier, the information propagating along said conductor being depending on said driving voltage, said driving voltage being the difference coefficient of $n$th order of the stored signal.

11. The process of claim 1, comprising reading out said information carrier non-destructively, said reading out being dependent on the number of successive short term remagnetizations of said information carrier, whereby $n$ of said remagnetizations cause readout of the $(n-1)$th differential quotient of said stored signal, with the stored signal being in analog form, said reading out comprising applying a driving voltage to said carrier, the information propagating along said conductor being dependent on said driving voltage, said driving voltage being the differential coefficient of the $n$th order of a step function causing a readout of the differential quotient of $n$th order of the stored signal.

12. The process as set forth in claim 1, comprising reading out said information carrier non-destructively, said reading out dependent on the number of successive remagnetizations of said information carrier, whereby $n$ of said remagnetizations cause readout of the $(n-1)$th difference quotient, said stored signal being in discrete form, said reading out comprising applying a driving voltage to said carrier, the information propagating along said conductor being the difference coefficient of $n$th order of the stored signal.

13. The process of claim 1, in which said information carrier is a hard magnetic and/or hard ferroelectric material and is attached to a soft magnetic and/or soft ferroelectric material, comprising remagnetizing and/or dielectric repolarizing said soft magnetic and/or soft ferroelectric material prior to remagnetization and/or dielectric repolarization of said information carrier to a state of magnetic and/or ferroelectric saturation, whereby said information carrier remains in a state of saturation until all information stored in said carrier has been removed from said carrier.

14. The process of claim 13, comprising removing said information from said information carrier non-destructively.

15. The process of claim 12, comprising removing said information from said information carrier by demagnetizing and/or dielectric depolarizing said carrier.

16. The process of claim 1, wherein said step of reading out comprises applying a driving voltage to said carrier.

17. The process of claim 16, wherein said step of applying a driving voltage comprises applying a step function to said carrier.

18. The process of claim 16, wherein said step of applying a driving voltage comprises applying an impulse function to said carrier.

19. The process of claim 16, wherein said step of applying a driving voltage comprises applying a high frequency impulse to said carrier.

20. The process of claim 1, in which said information carrier is a hard magnetic material and is attached to a soft magnetic material, comprising remagnetizing said soft magnetic material prior to remagnetization of said information carrier to a state of magnetic saturation, whereby said information carrier remains in a state of saturation until all information stored in said carrier has been removed from said carrier.

21. The process of claim 20, comprising removing said information from said information carrier non-destructively.

22. The process of claim 20, comprising removing said information from said information carrier by demagnetizing said carrier.

23. A process for the storage and readout of information in electromagnetic form which comprises:
   a. modulating an information carrier with an information signal, within the range of the reversible permeability or reversible dielectric constant of said information carrier, wherein the information carrier is comprised of a material from a group consisting of ferromagnetic, ferrimagnetic, antiferrimagnetic, ferroelectric and antiferroelectric, metamagnetic materials, said modulating comprising propagating said information signal along a conductor, b. forming an image of said information signal along a non-continuous propagation path of the information carrier in the form of values therealong of residual magnetism and/or residual dielectric polarization by short term high frequency pre-magnetization and/or short term high frequency dielectric pre-polarization of said information carrier, comprising applying an alternating electromagnetic field to said information carrier, and c. reading out the stored information by a short term magnetization step and/or short term dielectric polarization step comprising applying an alternating electromagnetic field to said information carrier.

* * * * *